(12) United States Patent
Nakamura

(10) Patent No.: US 7,909,666 B2
(45) Date of Patent: Mar. 22, 2011

(54) SOLDER ATTACHED CONTACT AND A METHOD OF MANUFACTURING THE SAME

(75) Inventor: Yuji Nakamura, Tokyo (JP)

(73) Assignee: Yamaichi Electronics Co., Ltd., Ohta-ku, Tokyo (JP)

( * ) Notice: Subject to any disclaimer, the term of this patent is extended or adjusted under 35 U.S.C. 154(b) by 76 days.

(21) Appl. No.: 12/446,432

(22) PCT Filed: Oct. 30, 2007

(86) PCT No.: PCT/JP2007/071147
§ 371 (c)(1),
(2), (4) Date: Apr. 20, 2009

(87) PCT Pub. No.: WO2008/053899
PCT Pub. Date: May 8, 2008

(65) Prior Publication Data
US 2010/0304625 A1    Dec. 2, 2010

(30) Foreign Application Priority Data

Nov. 1, 2006  (JP) .................................. 2006-297966

(51) Int. Cl.
*H05K 1/00* (2006.01)
(52) U.S. Cl. .................... 439/876; 228/180.21; 228/255
(58) Field of Classification Search .................. 439/83, 439/876; 29/843; 228/180.21, 255
See application file for complete search history.

(56) References Cited

U.S. PATENT DOCUMENTS

| | | | | |
|---|---|---|---|---|
| 3,780,433 A * | 12/1973 | Lynch | .......................... | 29/843 |
| 3,997,237 A * | 12/1976 | White | ......................... | 439/876 |
| 4,274,699 A * | 6/1981 | Keim | ............................. | 439/637 |
| 4,396,140 A * | 8/1983 | Jaffe et al. | ................. | 228/122.1 |
| 4,661,887 A * | 4/1987 | Lin | ............................... | 361/773 |
| 5,104,324 A * | 4/1992 | Grabbe et al. | ................. | 439/62 |
| 6,227,877 B1 * | 5/2001 | Mou et al. | ....................... | 439/83 |
| 6,636,063 B2 * | 10/2003 | Arnold et al. | ................ | 324/762 |
| 6,717,421 B1 | 4/2004 | Kazama | | |
| 7,377,788 B2 * | 5/2008 | Hasegawa | ....................... | 439/66 |
| 7,695,329 B2 * | 4/2010 | Peloza et al. | ................. | 439/876 |
| 2001/0054906 A1 | 12/2001 | Fujimura | | |
| 2002/0017915 A1 | 2/2002 | Kamiya | | |
| 2002/0060580 A1 | 5/2002 | Yamabe | | |

(Continued)

FOREIGN PATENT DOCUMENTS

JP    2001-330627    11/2001

(Continued)

*Primary Examiner* — Neil Abrams

(74) *Attorney, Agent, or Firm* — Finnegan, Henderson, Farabow, Garrett & Dunner, LLP

(57) ABSTRACT

There are provided the steps of preparing a contact (10, 20), which is formed from a metallic sheet including a base portion (11, 21), an elastic deformation portion (12, 22), and a contact portion (13, 23), and in which a recess (15, 25) is formed on a bottom surface of the base portion and a plurality of through-holes (16, 26, 27) are formed to be arranged above the recess and in parallel to the bottom surface of the base portion to extend through the base portion, and holding solder on the through-holes formed on the contact. A desired, solder-attached contact (10a, 20a) is fabricated by the manufacturing method. Further, the solder is a solder ball (90) and the step of holding solder includes the step of preparing the solder ball and the step of press fitting the solder ball into the through-hole.

7 Claims, 7 Drawing Sheets

U.S. PATENT DOCUMENTS

| | | |
|---|---|---|
| 2002/0061668 A1 | 5/2002 | Fujimura |
| 2002/0146920 A1 | 10/2002 | Sugiyama |

FOREIGN PATENT DOCUMENTS

| | | |
|---|---|---|
| JP | 2002-5960 | 1/2002 |
| JP | 2002-31652 | 1/2002 |
| JP | 2002-158264 | 5/2002 |
| JP | 2002-164104 | 6/2002 |
| JP | 2002-283049 | 10/2002 |
| JP | 2005-201844 | 7/2005 |
| JP | 2005-203606 | 7/2005 |
| WO | WO01/018553 | 3/2001 |

* cited by examiner

SOLDER ATTACHED CONTACT AND A METHOD OF MANUFACTURING THE SAME

TECHNICAL FIELD

The present invention relates to a solder-attached contact, which affords beforehand adhering solder to a contact being soldered to a circuit board, and a method of manufacturing the same.

BACKGROUND ART

In an examination jig for a device typified by a probe card, a FPD (flat panel display) lighting examination probe, etc., a plurality of contacts in contact with external contacts of a device to provide an electric connection between the device and a circuit board of an examination jig are implanted on the circuit board by means of soldering.

As a method of soldering a surface mounted component, such as a contact, to a circuit board of an examination jig, there is conventionally known a method of supplying a wire solder directly onto a pad as an external contact of an electric circuit on the circuit board to thermally melt the same. Alternatively, there is well-known a screen printing method of beforehand screen printing a solder paste on a pad of a circuit on a circuit board to thermally melt the same. Besides, like the screen printing method, a plating method, in which solder is beforehand plated, a solder dipping method of dipping a circuit board and a surface mounted component which are temporarily mounted, in a molten solder bath, etc. are made use of.

Patent Document 1: Japanese Patent Laid-Open No. 2002-164104

Patent Document 2: Japanese Patent Laid-Open No. 2002-283049

DISCLOSURE OF THE INVENTION

In recent years, miniaturization of a device to be examined is promoted and external contacts thereof are made minute in pitch. In keeping with this, it is required that contacts of an examination jig be arranged at minute pitch on a circuit board to be soldered thereto.

When the pitch is made minute in this manner, it becomes difficult for supply of a wire solder to cope with the situation, and with the screen printing method, the ratio of a solder particle diameter to a metal mask opening dimension becomes large and stable solder supply is difficult due to influences of dispersion in adhesion of solder and solder particle diameter. Also, with the electroless deposition, a thick film is not essentially formed, the quantity of solder is short, and a sufficient mounting strength is not obtained, while the electroplating is difficult to provide for a constant linewidth on a circuit with complex wiring with the result that there is a fear of generation of dispersion in solder mounting strength. Further, with the solder dipping method, bridge is liable to generate in case of minute pitch and dispersion is brought about according to the state of a pad and a solder bath, so that there is a fear of difficulty in solder supply.

In view of such problems, it is an object of the invention to provide a solder-attached contact, in a predetermined position of which a desired quantity of solder is beforehand adhered so as to stably supply solder and to obtain a large solder mounting strength, and a method of manufacturing the same.

In order to attain the object, the invention has a feature in a solder-attached contact formed from a metallic sheet including a base portion, an elastic deformation portion, and a contact portion, the contact comprising a recess formed on a bottom surface of the base portion and a plurality of through-holes arranged above the recess and in parallel to the bottom surface of the base portion to extend through the base portion, and wherein solder is held on the through-holes.

Also, the invention has a feature in a method of manufacturing a solder-attached contact, the method comprising the steps of: preparing a contact which is formed from a metallic sheet including a base portion, an elastic deformation portion, and a contact portion, and in which a recess is formed on a bottom surface of the base portion and a plurality of through-holes are formed to be arranged above the recess and in parallel to the bottom surface of the base portion to extend through the base portion, and holding solder on the through-holes formed on the contact.

Also, in the method of manufacturing a solder-attached contact, according to the invention, the through-holes may comprise a circular-shaped hole or an elliptical-shaped hole.

Further, the method of manufacturing a solder-attached contact, according to the invention, has a feature in that the solder comprises a solder ball, and the step of holding solder comprises the step of preparing the solder ball and the step of press fitting the solder ball into the through-hole.

Alternatively, the solder may comprises a wire solder, and the step of holding solder may comprise the step of preparing the wire solder, the step of cutting the wire solder to a predetermined length, and the step of crushing the predetermined length of wire solder with the through-hole therebetween.

With the solder-attached contact and the method of manufacturing the same, according to the invention, small holes are provided on the base portion of the contact and solder beforehand adheres to the small holes, whereby in soldering the contact to a circuit board, short-circuit between adjacent pitches and a decrease in bond strength due to shortage of solder as supplied are prevented and an improvement in quality is achieved electrically. Also, any specific supply of solder is not needed and yield caused by supply of solder can be eliminated.

Also, solder is simply available in the use of wire solder or solder balls and adjusting the quantity of solder as supplied and attaching solder to a contact are easy.

BEST MODE FOR CARRYING OUT THE INVENTION

Figure 1:
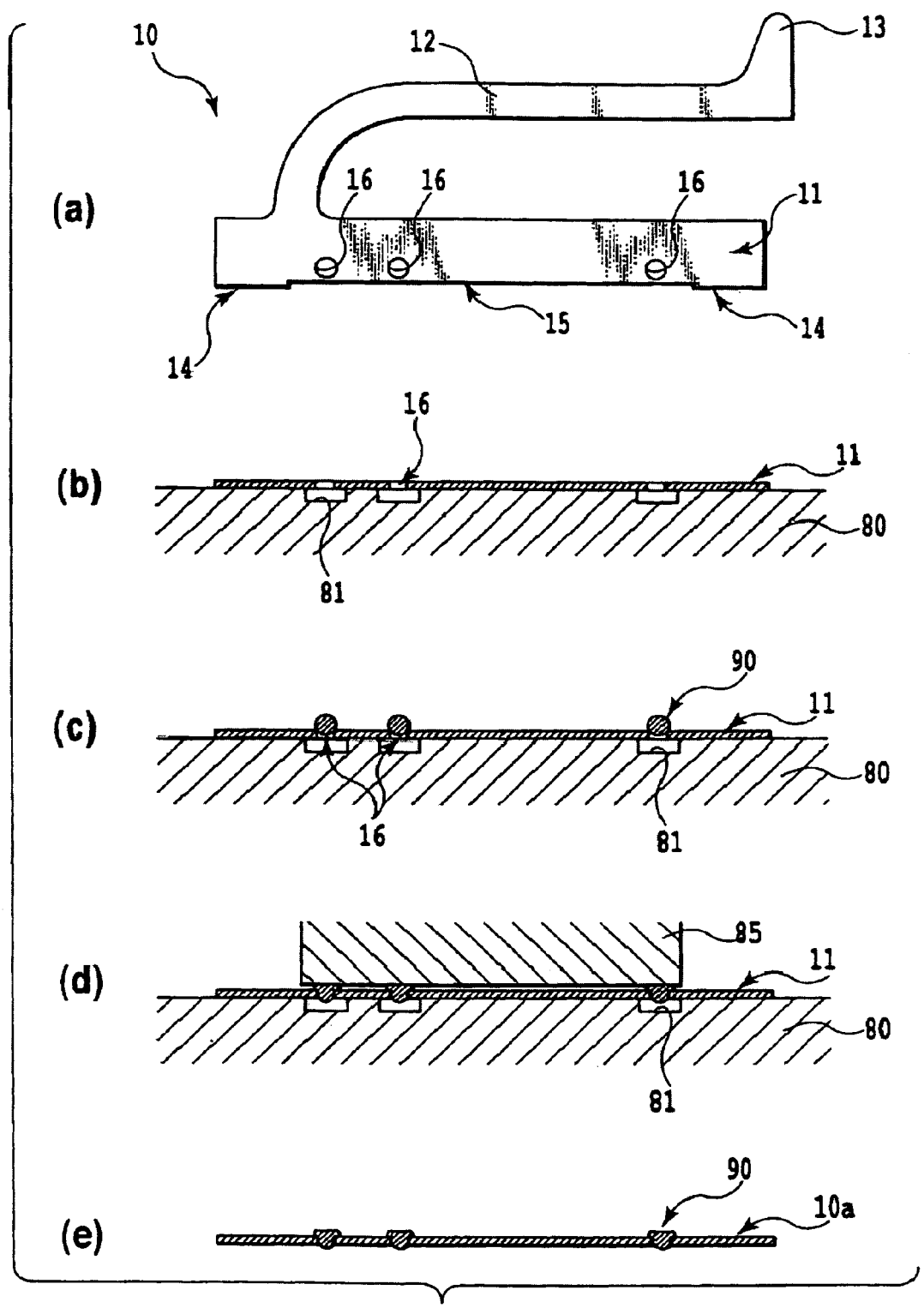
FIG. 1 shows a first embodiment of a method of manufacturing a solder-attached contact according to the invention, FIG. 1(a) being a side view showing the structure of a contact, and FIGS. 1(b) to 1(e) showing manufacturing processes of a solder-attached contact in this order.

A solder-attached contact according to the invention and a method of manufacturing the same will be described in detail below with reference to FIGS. 1 to 7.

First Embodiment

FIG. 1(a) shows the structure of a contact 10, according to the first embodiment, with solder adhered thereto. The contact 10 is punched and fabricated from an electrically conductive, metallic sheet by means of press working. The contact 10 substantially includes abase portion 11, an elastic deformation portion 12, and a contact portion 13.

The base portion 11 supports the elastic deformation portion 12 and the contact portion 13 arranged at a tip end of the elastic deformation portion 12. The contact portion 13 comes into contact with an external contact of a device (not shown) to provide an electric connection between the device and an examination jig through the base portion 11 and the elastic deformation portion 12.

A bottom surface 14 of the base portion 11 is soldered to an external contact 101 of a circuit board 100 (see FIG. 3) of the examination jig to fix the contact 10 to the circuit board 100. The bottom surface 14 of the base portion 11 is smaller in width (a vertical length of the base portion 11 in FIG. 1(b)) and in length (a horizontal length of the base portion 11 in FIG. 1(b)) than the external contact 101 of the circuit board 100. A shallow recess 15 is formed on the bottom surface 14 of the base portion 11 with both longitudinal (left and right in FIG. 1(a)) ends thereof left. The recess 15 may be continuous as in the present embodiment, or discrete. The depth of the recess 15 is appropriately set but is preferably about 50 μm.

Also, in the present embodiment, a plurality of small, circular-shaped holes 16 extending through the base portion 11 are formed above and in the vicinity of the recess 15. As shown in FIG. 1(a), the plurality of small holes 16 is disposed at appropriate intervals in parallel to the bottom surface 14 of the base portion 11. Solder balls are mounted to all the plurality of small holes 16 as described later. From this, the small holes 16 are set in number, positions of arrangement, and diameter taking into consideration a quantity of solder required for soldering the contact 10 to the circuit board 100, and a diameter of solder balls.

By forming the recess 15 and the plurality of small holes 16 on the base portion 11 of the contact 10 in this manner, it is possible to achieve an increase in solder mounting strength when the base portion 11 is to be soldered to the circuit board 100.

The elastic deformation portion 12 is substantially L-shaped to rise vertically upward from the vicinity of one end of the base portion 11 and extend to the vicinity of the other end of the base portion 11 in parallel to the base portion 11 with a curved portion therebetween. A free end of the elastic deformation portion 12 is formed as the contact portion 13, which comes into contact with an external contact of a device to be examined. The contact portion 13 is preferably in the form of a probe projecting vertically upward at the free end of the elastic deformation portion 12. The shape of the elastic deformation portion 12 is not limited to the present embodiment but a construction, in which the contact portion 13 can be displaced up and down in a vertical direction, suffices. As shown in, for example, FIG. 7(a), the elastic deformation portion 12 is dog-legged in shape to lead to a decrease in mounting area, thus enabling mounting the contacts 10 at high density. Alternatively, as shown in FIG. 7(b), the elastic deformation portion 12 may be in the form of a twin-beam having two elastic deformation arms 12a, 12b. In this case, the two elastic deformation arms 12a, 12b are connected vertically to each other to define a substantially rectangular shape whereby the contact portion 13 is inhibited from falling forward and sure contact can be accomplished even in an area, in which an external contact of a device is minute.

An explanation will be given to a method of manufacturing a solder-attached contact, according to the invention, to which solder adheres beforehand so as to enable supplying a required solder in order to solder the contacts 10, described above, to the circuit board 100 of an examination jig.

In the present embodiment, as shown in FIG. 1(b), the contact 10 punched from a metallic sheet is arranged on a bed 80 with one side thereof directed downward. Formed on the bed 80 are a plurality of escape holes 81 (or receiving holes 182; see FIG. 6(b)) corresponding respectively to the plurality of small holes 16 provided on the base portion 11 of the contact 10. Accordingly, the contact 10 is arranged to have the small holes 16 positioned on the holes 81.

Subsequently, as shown in FIG. 1(c), solder balls 90 are placed on the small holes 16 from an upwardly directed side of the contact 10. As understood from this, the small holes 16 are smaller in diameter than the solder balls 90.

After the plurality of solder balls 90 are placed on the plurality of small holes 16, a press jig 85 is used to push the solder balls 90 into the small holes 16 as shown in FIG. 1(d) and the solder balls 90 are crushed on a side toward the press to adhere to the contact 10. Thereby, a solder-attached contact 10a shown in FIG. 1(e) is completed. In addition, while the solder balls are crushed only on the side toward the press in the present embodiment, they may be crushed on both sides thereof with the small holes 16 therebetween as in a fourth embodiment described later.

Figure 2:
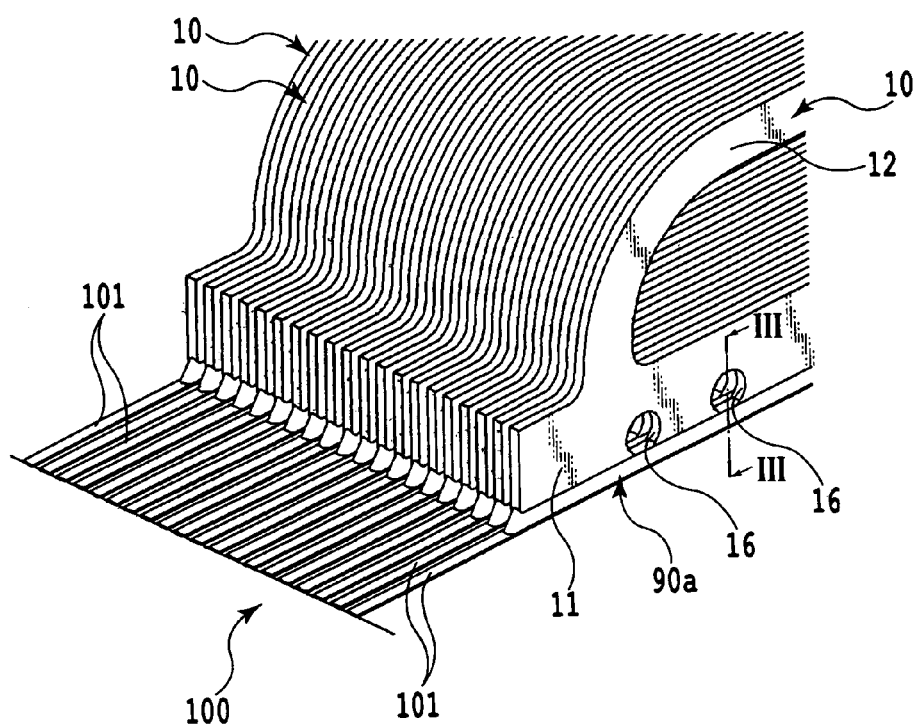
FIG. 2 is a partially enlarged, perspective view showing a state, in which a solder-attached contact manufactured by a first manufacturing method according to the invention is soldered to a circuit board.
Figure 3:
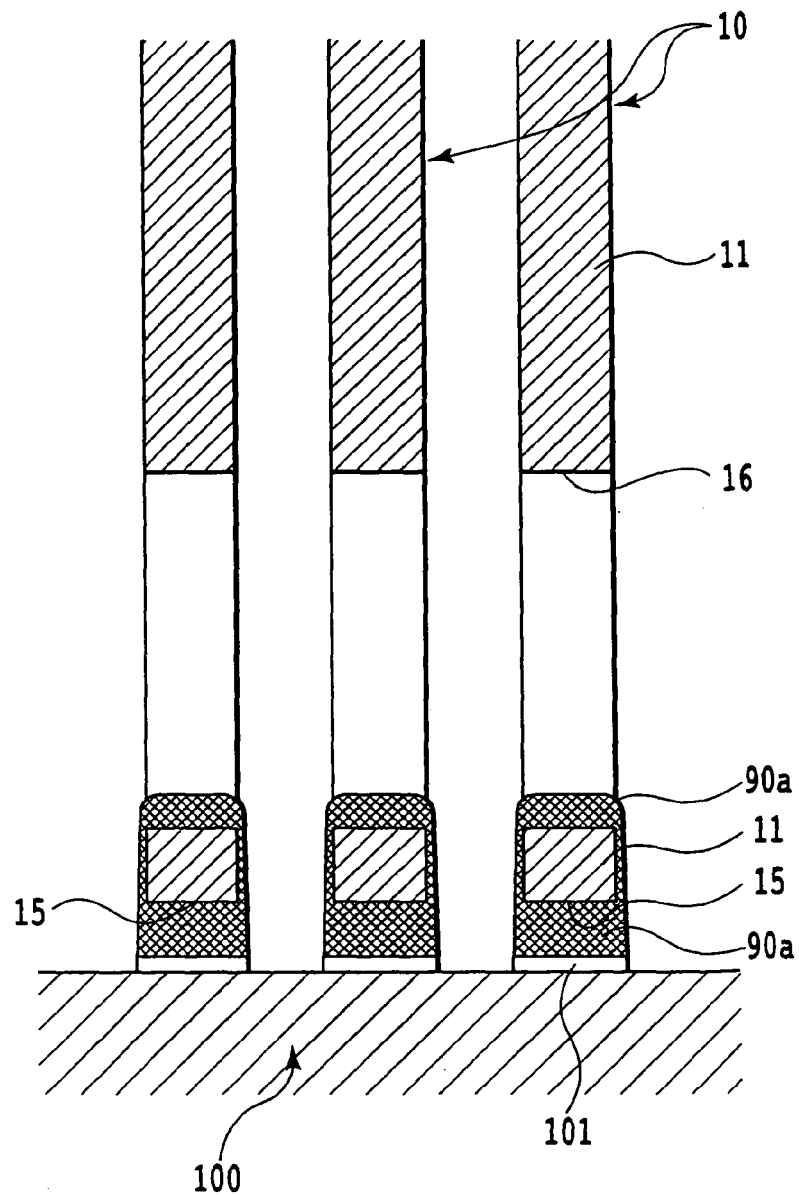
FIG. 3 is a partially enlarged, cross sectional view taken along the line III-III in FIG. 2.
Figure 4:
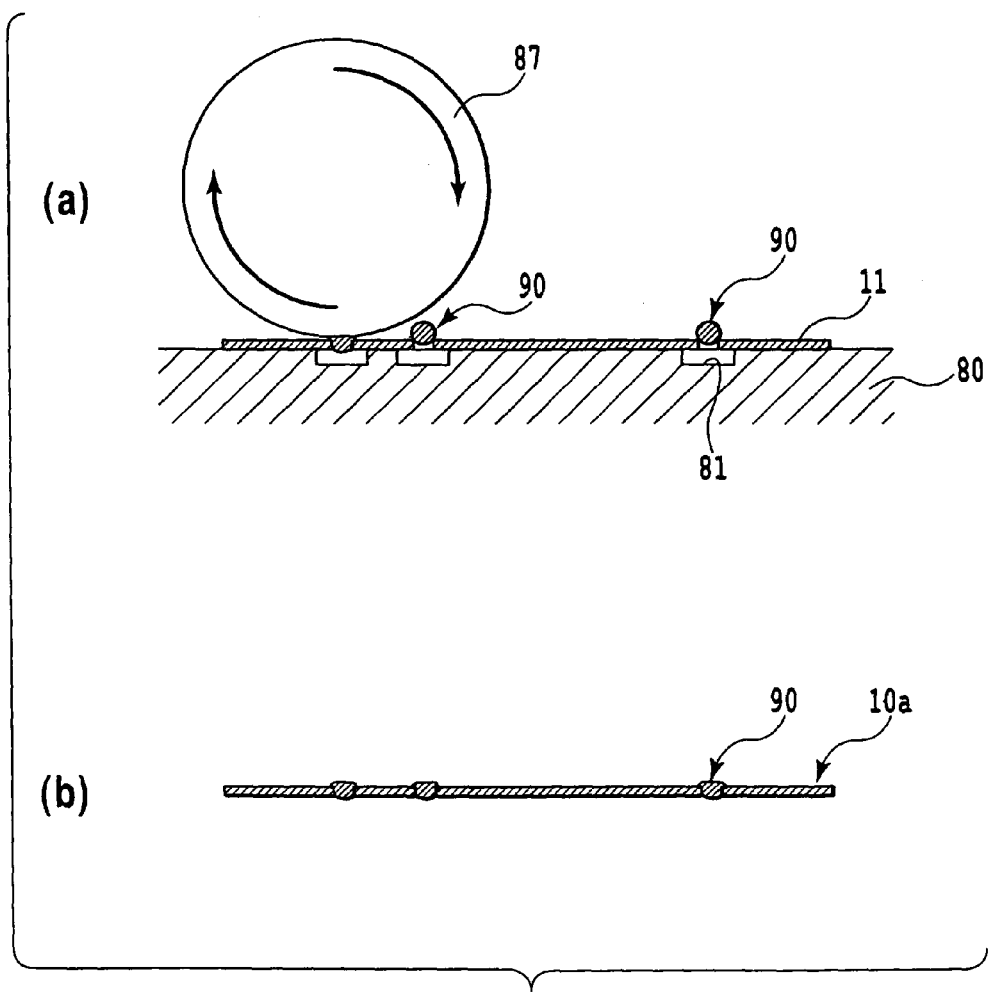
FIG. 4 shows a second embodiment of the invention, FIGS. 2(a) and 2(b) showing manufacturing processes of a solder-attached contact, corresponding to the manufacturing processes (d) and (e) in FIG. 1.
Figure 5:
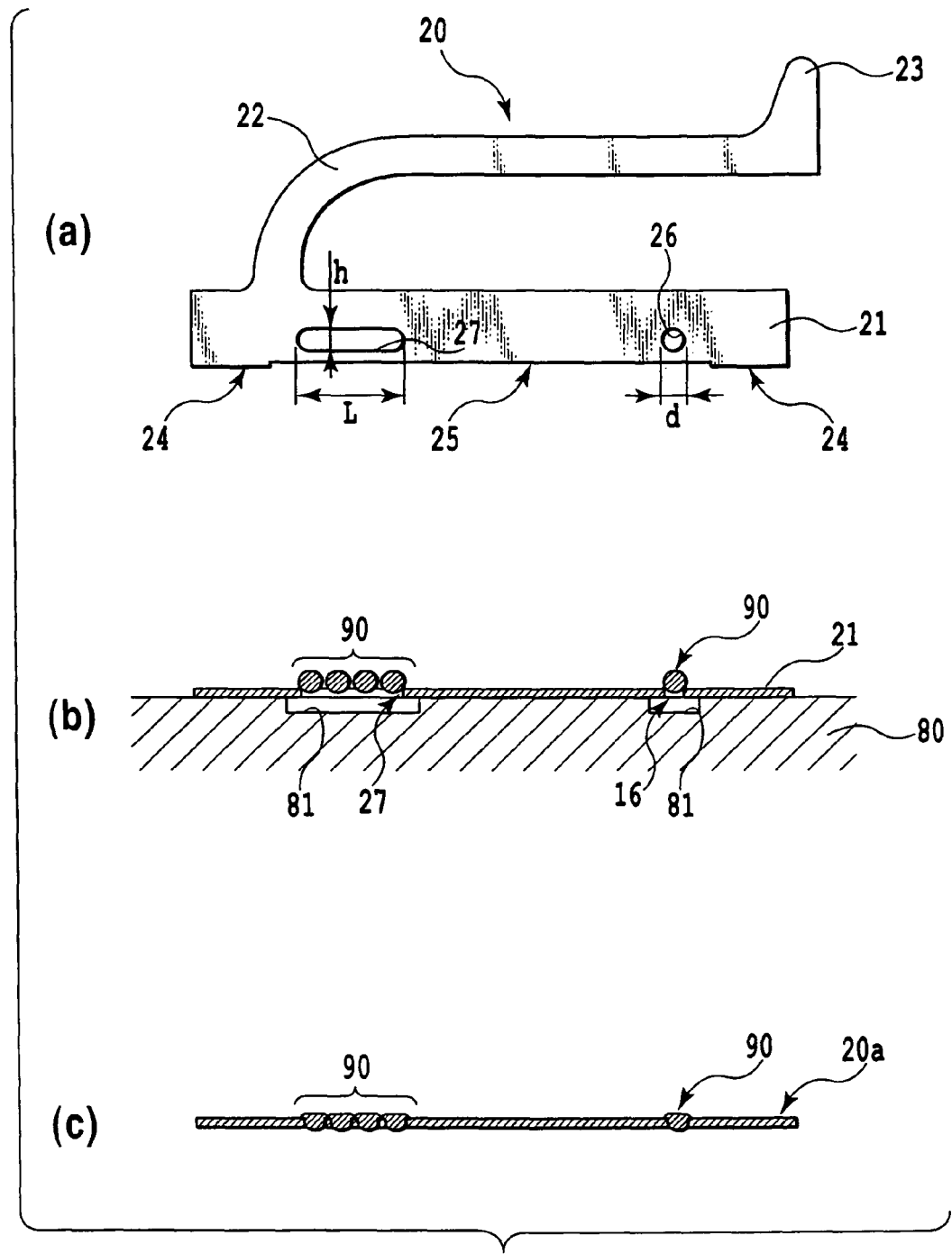
FIG. 5 shows a third embodiment of the invention, FIG. 5(a) being a side view showing the structure of a contact, and FIGS. 5(b) and 5(c) showing manufacturing processes of a solder-attached contact, corresponding to the manufacturing processes (c) and (e) in FIG. 1.
Figure 6:
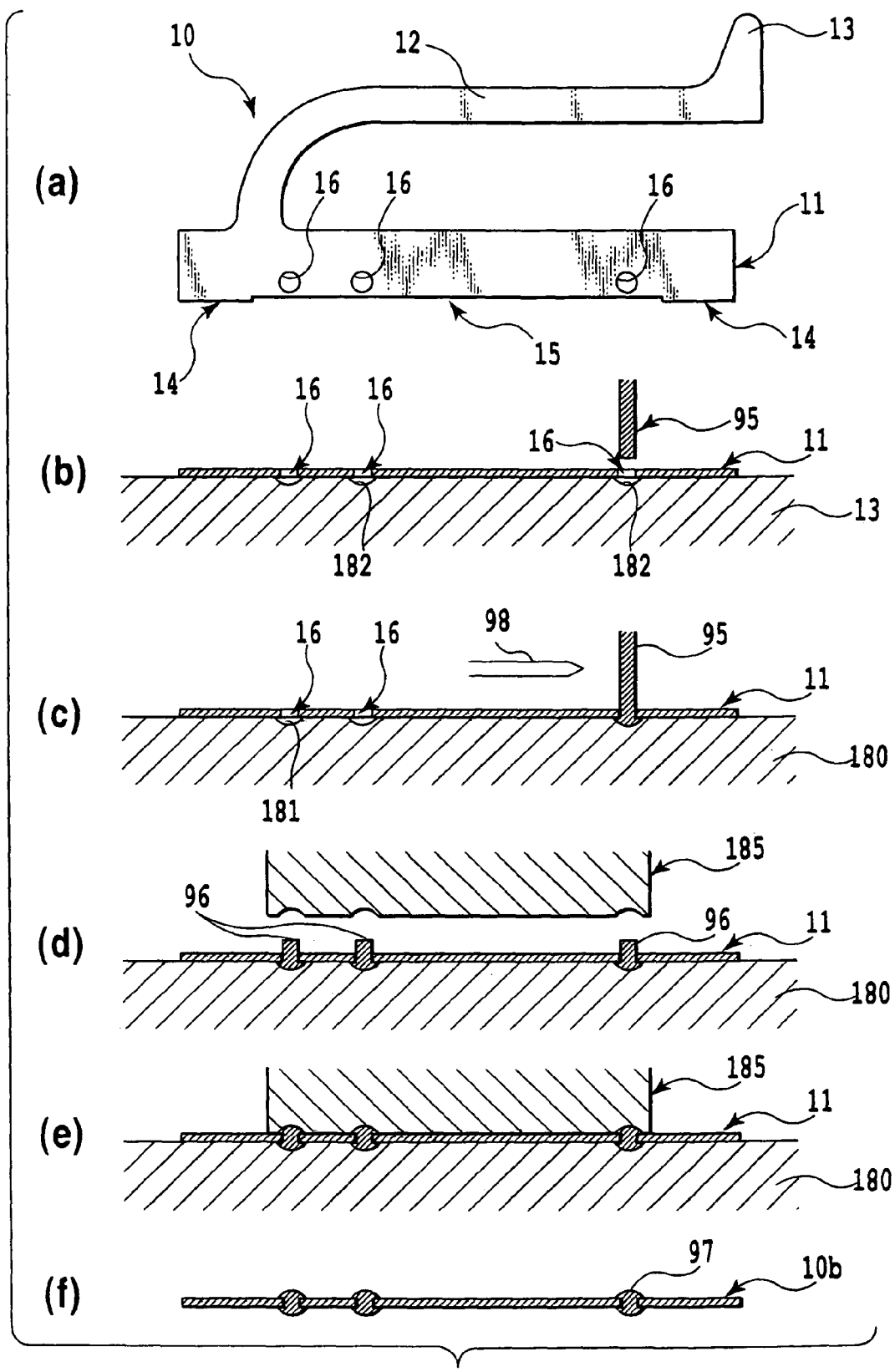
FIG. 6 shows a fourth embodiment of the invention, FIG. 6(a) being a side view showing the structure of a contact, and FIGS. 6(b) to 6(f) showing manufacturing processes of a solder-attached contact in this order.
Figure 7:
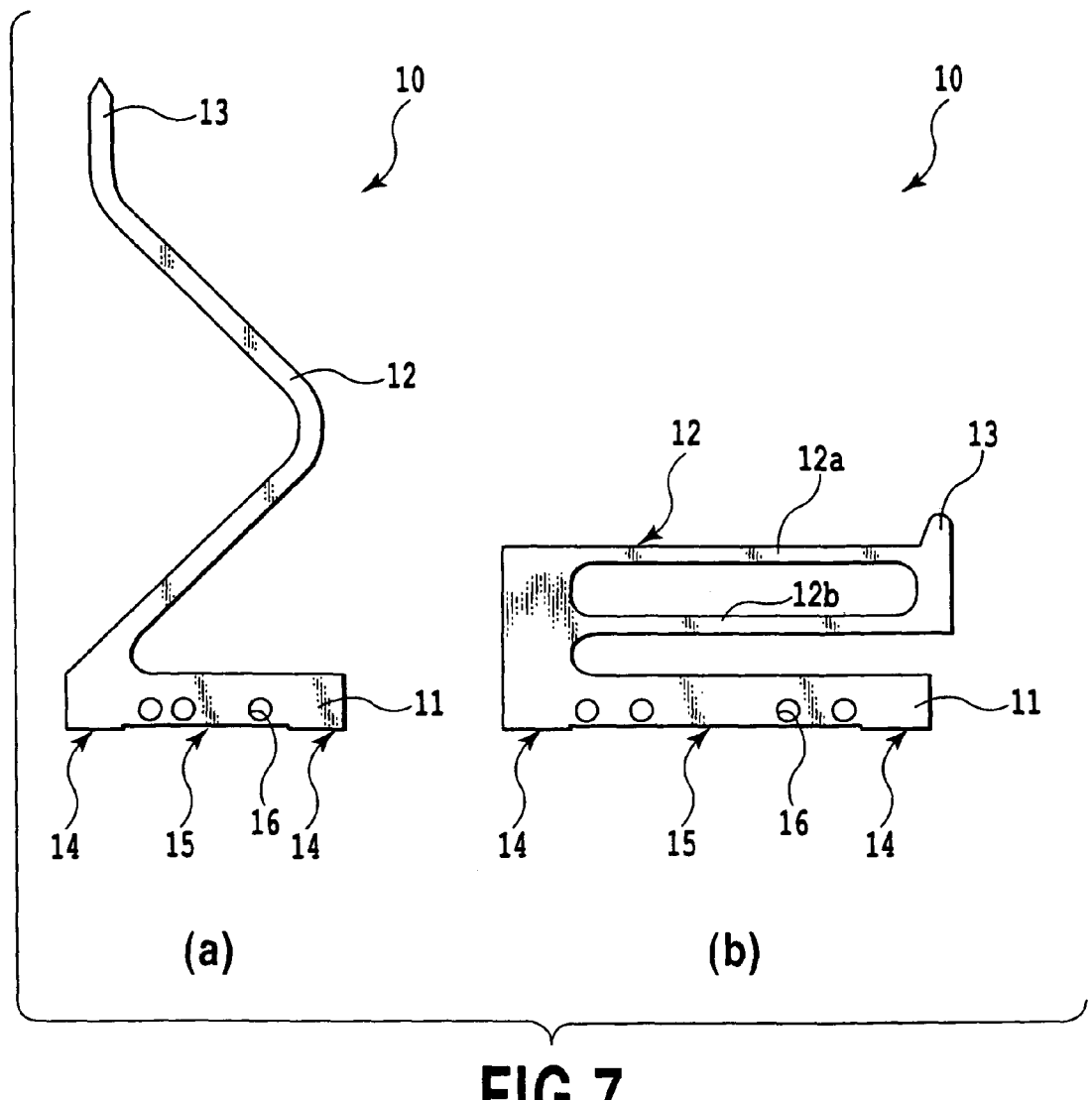
FIG. 7 shows examples of other contacts according to the invention, FIG. 7(a) showing a contact, whose elastic deformation portion is dog-legged in shape, and FIG. 7(b) showing a contact in the form of a twin-beam.

The solder-attached contact 10a is arranged in a predetermined position on the circuit board 100 of an examination jig and the solder balls 90 attached are thermally melted whereby it is possible to solder the contact 10 to the circuit board 100 of, for example, a probe card, which constitutes an examination jig, as shown in FIGS. 2 and 3.

Specifically, the following procedure is adopted to complete an examination jig.

(i) A part of the solder-attached contact 10a is attracted and held by using a conveyance head to mechanically grasp the same, or by measures such as air vacuum, static electrical charge, magnetic force, or the like.

(ii) At least two or more coordinate references are provided on a circuit board (probe card) 100, positions of the coordinate references are recognized by means of image recognition, laser scanning, or the like, and coordinates of the circuit board and the conveyance head are corrected by a controller.

(iii) The conveyance head holding the solder-attached contact 10a moves to a mounting position as programmed to arrange the solder-attached contact 10a in a predetermined posture on a pad 101 as an external contact of the circuit board.

(iv) While the posture of the solder-attached contact 10a is maintained by the conveyance head, laser is irradiated on a mounted portion to melt the solder balls 90 adhered to the contact 10 to electrically and mechanically join the circuit board 100 and the contact 10.

(v) By repeating the processes described above, the plurality of contacts 10 are mounted on the circuit board 100 of a probe card and the like, which constitutes an examination jig, etc. to complete the examination jig.

FIGS. 2 and 3 show a state, in which the plurality of contacts 10 are soldered to the external contacts 101 of the circuit board 100. As shown in detail in FIG. 3, a part of solder 90a melted by laser goes along both sides of the base portion 11 to enter a space defined by the recess 15 and a surface of the external contact 101 to electrically and mechanically join the base portion 11 and the external contact 101. Also, the remainder remains in the small holes 16 and covers the sides of the base portion 11 to mechanically firmly support the contact 10.

As described above, by using the solder-attached contact 10a manufactured according to the invention, the contact 10 can be more firmly held than that by the conventional method of soldering between the base portion 11 of the contact 10 and the external contact 101 and sides of the base portion. Accordingly, it becomes possible to increase that strength, with which the contact 10 is mounted to the circuit board 100 by soldering. Also, by appropriately setting the size of the solder balls 90 and the number of and positions of those small holes, to which the solder balls 90 are mounted, it is possible to supply solder, required for soldering, in proper quantities and to readily supply solder without the use of any specific solder supplying means and supplying method.

Second Embodiment

The second embodiment is the same as the first embodiment in the structure of a contact 10, to which solder adheres, in that solder as adhered comprises solder balls 90, and in that the solder balls 90 are adhered to the contact 10 by pushing the solder balls into small holes 16 provided on the contact 10 to crush the same. The present embodiment is different from the first embodiment only in the use of a press roller 87 for pushing the solder balls 90 into the small holes 16 and crushing the solder balls 90 as shown in FIG. 4(a). The solder balls 90 can be continuously mounted by using the press roller 87 and by arranging the contact 10 in series. As shown in FIG. 4(b), a solder-attached contact 10a as completed is the same as that in the first embodiment.

Third Embodiment

The third embodiment is different from the first embodiment only in the structure of a contact, to which solder adheres. A contact 20 in the present embodiment is punched and formed from an electrically conductive, metallic sheet by means of press working as shown in FIG. 5(a), and substantially includes a base portion 21, an elastic deformation portion 22, and a contact portion 23.

A shallow recess 25 is formed on a bottom surface 24 of the base portion 21 with both longitudinal (left and right in FIG. 5(a)) ends thereof left. The recess 25 may be continuous as in the embodiment, or discrete. The depth of the recess 25 is appropriately set. In the present embodiment, a small hole 26 having substantially the same size as that in the first embodiment and extending through the base portion 21 and an elongated hole (referred below to as "long hole") 27 in the form of an ellipse parallel to a bottom surface of the recess 25 are formed above and in the vicinity of the recess 25. The long hole 27 also extends through the base portion 21. The width h (a vertical length in FIG. 5(a)) of the long hole 27 is substantially the same as a diameter d of the small hole. In addition, the length (a horizontal length in FIG. 5(a)) L of the long hole is appropriately set according to the quantity of solder required for soldering. In the present embodiment, while the small hole 26 and the long hole 27 are present together, this is not limitative but, for example, a plurality of long holes 27 having the same length L will do, and a plurality of long holes 27 having different lengths L will do. The long hole 27 can be formed in a direction perpendicular to the bottom surface of the recess 25 according to circumstances. In any way, the small hole 26 and the long hole 27 are appropriately set in number, positions of arrangement, diameter, and length according to the quantity of solder required for soldering.

In the present embodiment, as shown in FIG. 5(b), a single solder ball is placed on the small hole 26 and a plurality (set number) of solder balls 90 are placed on the long hole 27. Mounting of the solder balls 90 to the contact 20 is accomplished by using means such as the press jig (see FIG. 1(d)) of the first embodiment or the press roller (see FIG. 4(a)) of the second embodiment to press fit the solder balls 90 into the small hole 26 and the long hole 27. FIG. 5(c) is a cross sectional view showing an essential part of a solder-attached contact 20a as completed.

The solder-attached contact 20a fabricated in this manner is soldered to the external contacts 101 of the circuit board 100, which constitutes an examination jig, shown in FIGS. 2 and 3 and in the same manner as illustrated in the first embodiment to complete the examination jig. In the present embodiment, the complex adjustment of the quantity of solder required can be more readily made by adopting the long hole 27 for the contact 20.

Fourth Embodiment

The fourth embodiment is different from the first embodiment only in that solder adhered is not a solder ball 90 but a wire solder 95 is used. Accordingly, a contact 10, to which solder adheres, is the same as that in the first embodiment shown in FIG. 6(a).

In the present embodiment, as shown in FIG. 6(b), the contact 10 punched from a metallic sheet is arranged on a bed 180 with one side surface thereof directed downward. Receiving holes 182 are formed on the bed 180 to correspond to small holes 16 of the contact. Accordingly, the contact 10 is arranged so that the small holes 16 are positioned on the receiving holes 182.

Subsequently, the wire solder 95 is prepared, the wire solder 95 is caused to extend through the small hole 16 to strike against the receiving hole 182 of the bed 180 and deformed a little according to the shape of the receiving hole 182, and a predetermined length of the wire solder 95 is cut by a cutting jig 98 to provide for a desired quantity of solder as set as shown in FIG. 6(c). Subsequently, as shown in FIGS. 6(d) and 6(e), a wire solder 96 as cut is pressed by a press jig 185, so that a portion of the wire solder 96 protruding from both side surfaces of the base portion 11 of the contact 10 is crushed. In addition, the shape of the solder crushed on the both side surfaces of the base portion 11 with the small hole 16 therebetween is preferably symmetrical with the small hole 16 therebetween as shown in FIG. 6(f). Thereby, as shown in FIG. 6(f), a solder-attached contact 10b, on which a desired quantity of solder 97 is held, is completed.

In the embodiment, the solder-attached contact 10b can be manufactured inexpensively by using the wire solder 95 in place of the solder ball 90.

The solder-attached contact 10*b* fabricated in this manner is soldered to the external contacts 101 of the circuit board 100, which constitutes an examination jig, shown in FIGS. 2 and 3 and in the same manner as illustrated in the first embodiment to complete the examination jig.

The invention claimed is:

1. A solder-attached contact formed from a metallic sheet including a base portion, an elastic deformation portion, and a contact portion, the contact comprising
   a recess formed on a bottom surface of the base portion and a plurality of through-holes arranged above the recess and in parallel to the bottom surface of the base portion to extend through the base portion, and
   wherein solder is held on the through-holes.

2. The solder-attached contact according to claim 1, wherein the elastic deformation portion is in the form of a twin-beam.

3. A method of manufacturing a solder-attached contact, the method comprising the steps of: preparing a contact, which is formed from a metallic sheet including a base portion, an elastic deformation portion, and a contact portion, and in which a recess is formed on a bottom surface of the base portion and a plurality of through-holes are formed to be arranged above the recess and in parallel to the bottom surface of the base portion to extend through the base portion, and
   holding solder on the through-holes formed on the contact.

4. The method of manufacturing a solder-attached contact, according to claim 3, wherein the through-holes comprise a circular-shaped hole.

5. The method of manufacturing a solder-attached contact, according to claim 3, wherein the through-holes comprise an elliptical-shaped hole.

6. The method of manufacturing a solder-attached contact, according to claim 3, wherein the solder comprises a solder ball, and
   the step of holding solder comprises the step of preparing the solder ball and the step of press fitting the solder ball into the through-hole.

7. The method of manufacturing a solder-attached contact, according to claim 3, wherein the solder comprises a wire solder, and
   the step of holding solder comprises the step of preparing the wire solder, the step of cutting the wire solder to a predetermined length, and the step of crushing the predetermined length of wire solder with the through-hole therebetween.

* * * * *